(12) United States Patent
Hu

(10) Patent No.: US 9,768,191 B2
(45) Date of Patent: Sep. 19, 2017

(54) SEMICONDUCTOR DEVICE

(71) Applicant: TOSHIBA MEMORY CORPORATION, Minato-ku (JP)

(72) Inventor: Ming Hu, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/065,102

(22) Filed: Mar. 9, 2016

(65) Prior Publication Data

US 2017/0110472 A1    Apr. 20, 2017

Related U.S. Application Data

(60) Provisional application No. 62/243,301, filed on Oct. 19, 2015.

(51) Int. Cl.

| | | |
|---|---|---|
| *H01L 27/115* | (2017.01) | |
| *H01L 29/423* | (2006.01) | |
| *H01L 29/40* | (2006.01) | |
| *H01L 27/11582* | (2017.01) | |

(52) U.S. Cl.
CPC ...... *H01L 27/11582* (2013.01); *H01L 29/408* (2013.01); *H01L 29/4234* (2013.01)

(58) Field of Classification Search
CPC ............. H01L 27/11582; H01L 29/408; H01L 29/4234
See application file for complete search history.

(56) References Cited

U.S. PATENT DOCUMENTS

| | | |
|---|---|---|
| 7,981,786 B2 | 7/2011 | Joo et al. |
| 8,581,330 B2 | 11/2013 | Kiyotoshi et al. |
| 2010/0178759 A1* | 7/2010 | Kim .................. H01L 27/11521 438/591 |
| 2013/0207178 A1 | 8/2013 | Lee et al. |

* cited by examiner

*Primary Examiner* — Seahvosh Nikmanesh
(74) *Attorney, Agent, or Firm* — Oblon, McClelland, Maier & Neustadt, L.L.P.

(57) ABSTRACT

According to one embodiment, a semiconductor device includes a stacked body; a columnar portion; a plate portion; and a blocking insulating film. The stacked body includes a plurality of electrode layers. The columnar portion includes a semiconductor body and a charge storage film. The plate portion includes a conductor and a sidewall insulating film. The sidewall insulating film is provided between the conductor and the insulator and between the conductor and the electrode layers. The conductor contacts the major surface of the substrate. The blocking insulating film is provided between the sidewall insulating film and the insulator, between the insulator and the electrode layers, and between the charge storage film and the electrode layers. The blocking insulating film includes a first blocking insulating layer and a second blocking insulating layer, the second blocking insulating layer being different from the first blocking insulating layer.

21 Claims, 19 Drawing Sheets

SEMICONDUCTOR DEVICE

CROSS-REFERENCE TO RELATED APPLICATIONS

This application is based upon and claims the benefit of priority from U.S. Provisional Patent Application 62/243,301 field on Oct. 19, 2015; the entire contents of which are incorporated herein by reference.

FIELD

Embodiments described herein relate generally to a semiconductor device.

BACKGROUND

A memory device having a three-dimensional structure has been proposed in which a memory hole is made in a stacked body in which multiple electrode layers are stacked, and a charge storage film and a semiconductor film are provided to extend in the stacking direction of the stacked body in the memory hole. The electrode layers of the stacked body are gate electrodes of a drain-side selection transistor, a source-side selection transistor, and memory cells. The memory device includes the multiple memory cells connected in series between the drain-side selection transistor and the source-side selection transistor. The structure in which the drain-side selection transistor, the multiple memory cells, and the source-side selection transistor are connected in series is called a memory string. A slit that reaches the substrate from the upper surface of the stacked body is made in the stacked body. A conductor is filled into the slit. For example, the conductor is used to form a source line of the memory string. It is desirable to cause the cell current to flow quickly from the memory string toward the source line.

DETAILED DESCRIPTION

Figure 1:
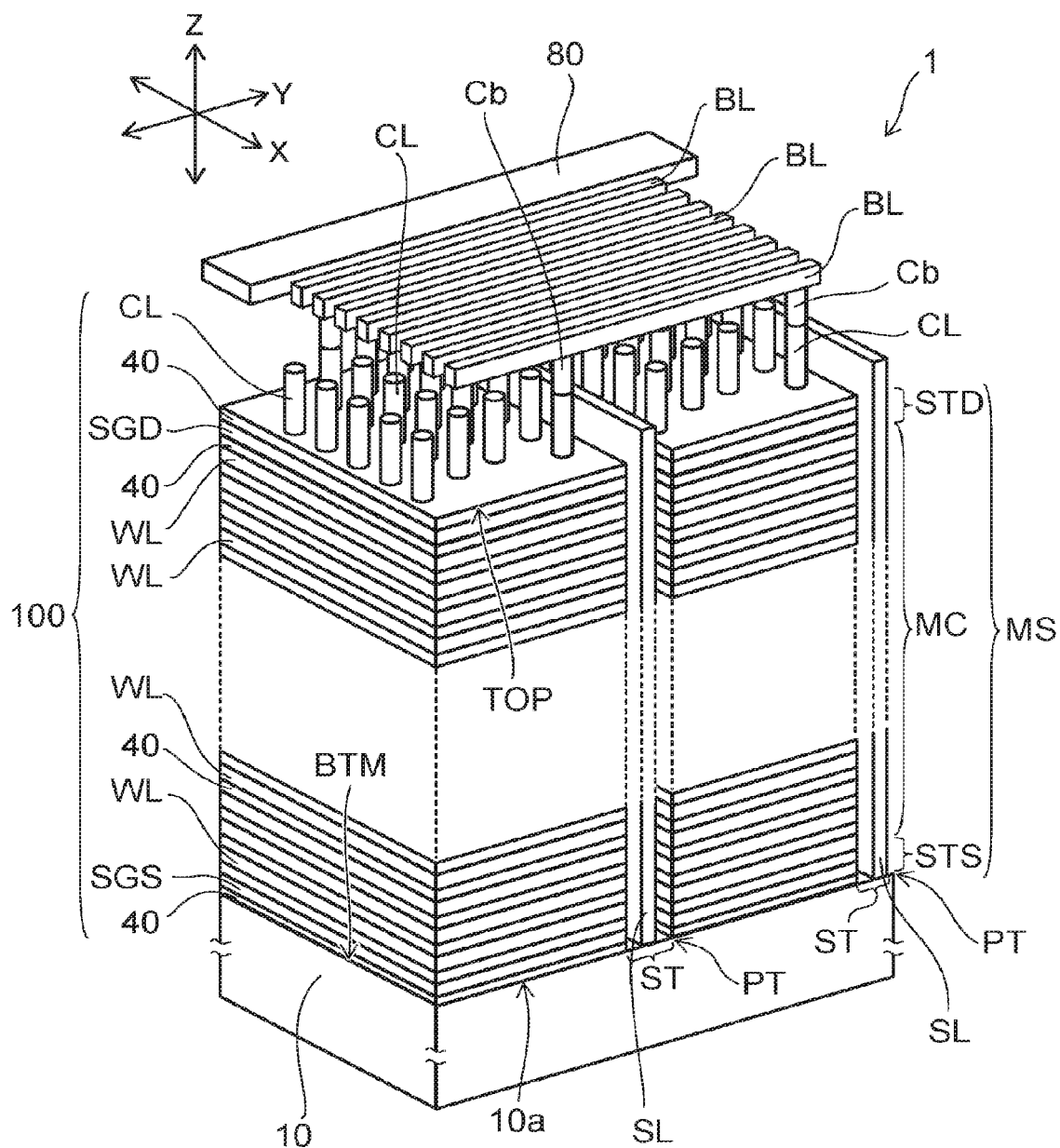
FIG. 1 is a schematic perspective view of a memory cell array of a semiconductor device of a first embodiment.

According to one embodiment, a semiconductor device includes a stacked body; a columnar portion; a plate portion; and a blocking insulating film. The stacked body includes a plurality of electrode layers stacked from the major surface of the substrate with an insulator interposed. The columnar portion extends along a stacking direction of the stacked body. The columnar portion includes a semiconductor body and a charge storage film. The charge storage film is provided between the semiconductor body and the electrode layers. The plate portion includes a conductor and a sidewall insulating film. The sidewall insulating film is provided between the conductor and the insulator and between the conductor and the electrode layers. The sidewall insulating film contacts the major surface of the substrate. The conductor contacts the major surface of the substrate. The blocking insulating film is provided between the sidewall insulating film and the insulator, between the insulator and the electrode layers, and between the charge storage film and the electrode layers. The blocking insulating film includes a first blocking insulating layer and a second blocking insulating layer, the second blocking insulating layer being different from the first blocking insulating layer.

Embodiments will now be described with reference to the drawings. In the respective drawings, like members are labeled with like reference numerals. Semiconductor devices of the embodiments are semiconductor memory devices having memory cell arrays.

FIG. 1 is a schematic perspective view of a memory cell array 1 of a semiconductor device of a first embodiment. In FIG. 1, two mutually-orthogonal directions parallel to a major surface 10a of a substrate 10 are taken as an X-direction and a Y-direction. The XY plane is a planar direction of a stacked body 100. A direction orthogonal to both the X-direction and the Y-direction is taken as a Z-direction (the stacking direction of the stacked body 100). In the specification, "down" refers to the direction toward the substrate 10; and "up" refers to the direction away from the substrate 10.

As shown in FIG. 1, the memory cell array 1 includes a stacked body 100, multiple columnar portions CL, and multiple slits ST. The stacked body 100 is provided on the major surface 10a of the substrate 10. In FIG. 1, arrow TOP indicates the upper end portion of the stacked body 100. Arrow BTM indicates the lower end portion of the stacked body 100. The stacked body 100 includes the multiple electrode layers (SGS, WL, and SGD) stacked from the major surface 10a with an insulator 40 interposed. A drain-side selection gate line SGD, multiple word lines WL, and a source-side selection gate line SGS are provided in the columnar portion CL.

The electrode layers (SGD, WL, and SGS) are stacked to be separated from each other. The electrode layer SGS is a source-side selection gate line. The electrode layer SGD is a drain-side selection gate line. The electrode layer WL is a word line. The number of stacks of the electrode layers (SGD, WL, and SGS) is arbitrary. The electrode layers (SGD, WL, and SGS) include a conductor. The conductor includes, for example, tungsten. The insulator 40 is disposed in each region between the electrode layers (SGD, WL, and SGS). The insulator 40 may be an insulator such as a silicon oxide film, etc., or may be an air gap.

The source-side selection gate line SGS is provided on the major surface 10a of the substrate 10 with the insulator 40 interposed. The substrate 10 is, for example, a semiconductor substrate. The semiconductor substrate includes, for example, silicon. The multiple word lines WL are provided, with the insulator 40 interposed, on the source-side selection gate line SGS. The drain-side selection gate line SGD is provided, with the insulator 40 interposed, on the word line WL of the uppermost layer.

At least one selection gate line SGD is used as a gate electrode of a drain-side selection transistor STD. At least one selection gate line SGS is used as a gate electrode of a source-side selection transistor STS. Multiple memory cells MC are connected in series between the drain-side selection transistor STD and the source-side selection transistor STS. One of the word lines WL is used as a gate electrode of the memory cell MC. A memory string MS has a structure in which the drain-side selection transistor STD, the multiple memory cells MC, and the source-side selection transistor STS are connected in series.

The slit ST is provided in the stacked body 100. The slit ST extends along the stacking direction of the stacked body 100 (the Z-direction) and the major surface direction of the substrate 10 (the X-direction) through the stacked body 100. The slit ST divides the stacked body 100 into a plurality in the Y-direction orthogonal to the X-direction. The region that is divided by the slit ST is called a "block."

A plate portion PT is provided in the slit ST. The plate portion PT includes, for example, a source line SL that has a plate configuration, and a sidewall insulating film (not shown in FIG. 1) of the source line SL for insulating the source line SL having the plate configuration from the periphery. The source line SL is a conductor. The source line SL is insulated from the stacked body 100 by the sidewall insulating film. For example, the plate portion PT extends along the stacking direction of the stacked body 100 (the Z-direction) and the major surface direction of the substrate 10 (the X-direction). An upper layer interconnect 80 is disposed above the source line SL. The upper layer interconnect 80 extends in the Y-direction. The upper layer interconnect 80 is electrically connected to the multiple source lines SL arranged along the Y-direction.

The columnar portion CL is provided in the stacked body 100 divided by the slit ST. The columnar portion CL extends in the stacking direction of the stacked body 100 (the Z-direction). For example, the columnar portion CL is formed in a circular columnar or elliptical columnar configuration. For example, the columnar portion CL is disposed in a staggered lattice configuration or a square lattice configuration in the memory cell array 1. The memory string MS is disposed in the columnar portion CL.

Multiple bit lines BL are disposed above the upper end portion of the columnar portion CL. The multiple bit lines BL extend in the Y-direction. The upper end portion of the columnar portion CL is electrically connected via a contact portion Cb to one of the bit lines BL. One bit line BL is electrically connected to one columnar portion CL selected from each block.

Figure 2:
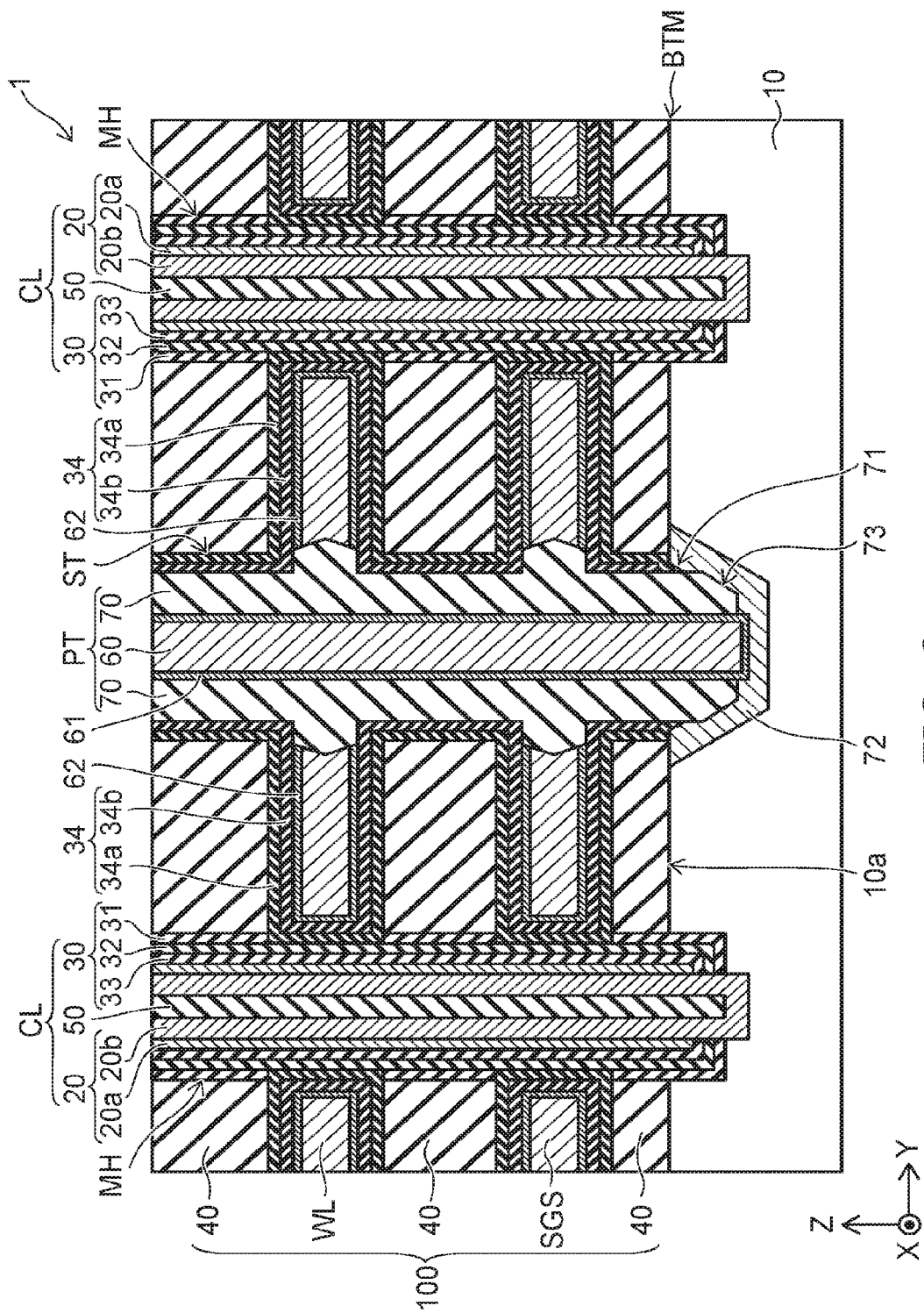
FIG. 2 is a schematic cross-sectional view of the memory cell array of the semiconductor device of the first embodiment.

FIG. 2 is a schematic cross-sectional view of the memory cell array 1 of the semiconductor device of the first embodiment. FIG. 2 corresponds to a cross section parallel to the Y-Z plane of FIG. 1. FIG. 2 shows the extracted lower end portion BTM side of the stacked body 100.

As shown in FIG. 2, the columnar portion CL is provided in a memory hole MH. The memory hole MH has a hole pattern. The memory hole MH is provided in the stacked body 100. The memory hole MH extends along the stacking direction of the stacked body 100 (the Z-direction) through the stacked body 100. The columnar portion CL includes a memory film 30, a semiconductor body 20, and a core layer 50.

The memory film 30 is provided on the inner wall of the memory hole MH. The configuration of the memory film 30 is, for example, a tubular configuration. The memory film 30 includes a cover insulating film 31, a charge storage film 32, and a tunneling insulating film 33.

The cover insulating film 31 is provided on the inner wall of the memory hole MH. The cover insulating film 31 includes, for example, silicon oxide. For example, the cover insulating film 31 protects the charge storage film 32 from the etching when forming the word lines WL.

The charge storage film 32 is provided on the cover insulating film 31. The charge storage film 32 includes, for example, silicon nitride. Other than silicon nitride, the charge storage film 32 may include hafnium oxide. The charge storage film 32 has trap sites that trap charge in a film. The threshold of the memory cell MC changes due to the existence/absence of the charge trapped in the trap sites and the amount of the trapped charge. Thereby, the memory cell MC retains information.

The tunneling insulating film 33 is provided on the charge storage film 32. For example, the tunneling insulating film 33 includes silicon oxide, or includes silicon oxide and silicon nitride. The tunneling insulating film 33 is a potential barrier between the charge storage film 32 and the semiconductor body 20. Tunneling of the charge occurs in the tunneling insulating film 33 when the charge is injected from the semiconductor body 20 into the charge storage film 32 (a programming operation) and when the charge is discharged from the charge storage film 32 into the semiconductor body 20 (an erasing operation).

The semiconductor body 20 is provided on the memory film 30. The semiconductor body 20 of the first embodiment includes a cover layer 20a and a channel layer 20b. The configuration of the cover layer 20a is, for example, a tubular configuration. The configuration of the channel layer 20b is, for example, a tubular configuration having a bottom. The cover layer 20a and the channel layer 20b include, for example, silicon. The silicon is, for example, polysilicon made of amorphous silicon that is crystallized. The conductivity type of the silicon is, for example, a P-type. For example, the semiconductor body 20 is electrically connected to the substrate 10.

The core layer 50 is provided on the semiconductor body 20. The core layer 50 is insulative. The core layer 50 includes, for example, silicon oxide. The configuration of the core layer 50 is, for example, a columnar configuration.

The memory hole MH is filled with the memory film 30, the semiconductor body 20, and the core layer 50.

The plate portion PT is provided in the slit ST. The slit ST extends along the stacking direction of the stacked body 100 (the Z-direction) and the major surface direction of the substrate 10 (the X-direction). The slit ST refers to the region of the space pattern prior to the plate portion PT being provided. As described above, the plate portion PT includes a conductor 60 and a stacked body sidewall insulating film used to form the source line SL.

The sidewall insulating film 70 is provided between the conductor 60 and the insulator 40 and between the conductor 60 and the electrode layers (SGD, WL, and SGS: in FIG. 2, referring to SGS and WL). For example, the sidewall insulating film 70 contacts the major surface 10a at the lower end portion of the plate portion PT. The sidewall insulating film 70 includes, for example, silicon oxide. For example, the conductor 60 contacts the major surface 10a at the lower end portion of the plate portion PT. In the first embodiment, for example, the conductor 60 is provided, with a barrier film 61 interposed, on the major surface 10a and the sidewall insulating film 70. The conductor 60 includes, for example, tungsten. The barrier film 61 includes, for example, titanium. The barrier film 61 may include titanium and titanium nitride. For example, the conductor 60 is used to form the source line SL.

A blocking insulating film 34 is provided in the stacked body 100. The blocking insulating film 34 is provided between the sidewall insulating film 70 and the insulators 40, between the insulators 40 and the electrode layers (SGD, WL, and SGS), and between the memory film 30 (in the first embodiment, the charge storage film 32) and the electrode layers (SGD, WL, and SGS). The blocking insulating film 34 is provided along the stacking direction of the stacked body 100 (the Z-direction) between the sidewall insulating film 70 and the insulators 40. The blocking insulating film 34 is provided along the planar direction of the stacked body 100 (the XY plane) between the insulators 40 and the electrode layers (SGD, WL, and SGS). The blocking insulating film 34 is provided along the stacking direction of the stacked body 100 (the Z-direction) between the memory film 30 and the electrode layers (SGD, WL, and SGS). The blocking insulating film 34 extends along the stacking direction of the stacked body 100 (the Z-direction) via the regions between the insulators 40 and the electrode layers (SGD, WL, and SGS) and the regions between the memory film 30 and the electrode layers (SGD, WL, and SGS). The blocking insulating film 34 includes a first blocking insulating layer 34a and a second blocking insulating layer 34b.

The first blocking insulating layer 34a is provided on the memory film 30 side in the blocking insulating film 34. The first blocking insulating layer 34a is provided to be continuous from a lower end portion 34c of the blocking insulating film 34 toward the upper end portion of the blocking insulating film 34. In the first embodiment, the first blocking insulating layer 34a contacts the charge storage film 32, the cover insulating film 31, and the insulator 40.

The second blocking insulating layer 34b is provided on the electrode layers (SGD, WL, and SGS) side in the blocking insulating film 34. The second blocking insulating layer 34b is provided to be continuous along the first blocking insulating layer 34a. In the first embodiment, the second blocking insulating layer 34b contacts the electrode layers (SGD, WL, and SGS) via the first blocking insulating layer 34a, the sidewall insulating film 70, and a barrier film 62. The barrier film 62 includes, for example, titanium nitride. The barrier film 62 may include titanium and titanium nitride.

The first blocking insulating layer 34a is different from the second blocking insulating layer 34b. For example, the first blocking insulating layer 34a is an insulator having silicon oxide as a major component. The first blocking insulating layer 34a is, for example, $SiO_2$. The second blocking insulating layer 34b is an insulator having a metal oxide as a major component. The metal is, for example, aluminum. The second blocking insulating layer 34b is, for example, $Al_2O_3$. The first blocking insulating layer 34a has a first relative dielectric constant. The second blocking insulating layer 34b has a second relative dielectric constant that is higher than the first relative dielectric constant.

The substrate 10 includes a carrier in the portion where the memory cell array 1 is provided. The carrier is, for example, an acceptor. The acceptor is, for example, boron. Thereby, the conductivity type of the substrate 10 is the P-type in the portion where the memory cell array 1 is provided.

In the first embodiment, the substrate 10 includes a first recess portion 71 in the major surface 10a. The first recess portion 71 is provided in the substrate 10 to correspond to the slit ST. The plate portion PT is provided to correspond to the first recess portion 71. A semiconductor region 72 is provided in the substrate 10 to correspond to the first recess portion 71. The semiconductor region 72 includes, for example, an acceptor and a donor. The semiconductor region 72 is, for example, a region to which the donor is additionally introduced to the substrate 10. When the conductivity type of the substrate 10 is the P-type, the conductivity type of the semiconductor region 72 is the N-type or the P-type. When both the substrate 10 and the semiconductor region 72 are of the P-type, the carrier concentration (the effective acceptor concentration) of the semiconductor region 72 is, for example, lower than the substrate 10 of the P-type. This is because the donor that is the opposite conductivity type of the substrate 10 including the acceptor is additionally introduced to the semiconductor region 72. The acceptor is, for example, boron (B). The donor is, for example, arsenic (As) or phosphorus (P).

In the first embodiment, a second recess portion 73 is further included in the first recess portion 71. In the first embodiment, the blocking insulating film 34 contacts the first recess portion 71; and the sidewall insulating film 70 and the conductor 60 contact the second recess portion 73.

A method for manufacturing the semiconductor device of the first embodiment will now be described.

FIG. 3 to FIG. 14 are schematic cross-sectional views showing the method for manufacturing the semiconductor device of the first embodiment. The cross sections shown in FIG. 3 to FIG. 14 correspond to the cross section shown in FIG. 2.

Figure 3:
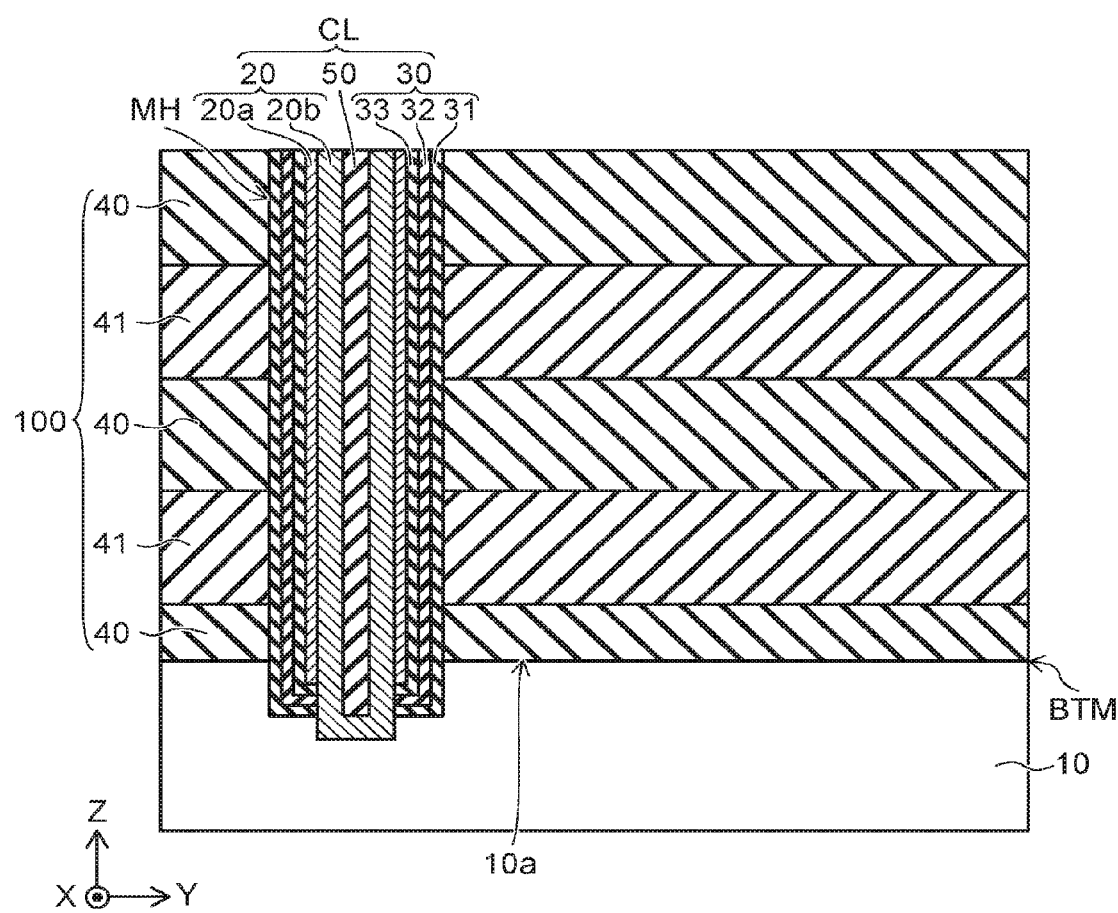
FIG. 3 to FIG. 14 are schematic cross-sectional views showing the method for manufacturing the semiconductor device of the first embodiment.

As shown in FIG. 3, the stacked body 100 is formed on the major surface 10a of the substrate 10 by alternately stacking the insulators 40 as first layers and replacement members 41 as second layers on the substrate 10. The replacement members 41 are layers that are replaced with the electrode layers (SGD, WL, and SGS) subsequently. The material of the replacement members 41 is selected from materials that are different from the insulators 40 and can provide etching selectivity with respect to the insulators 40. For example, when silicon oxide is selected as the insulators 40, silicon nitride is selected as the replacement members 41. The substrate 10 is a semiconductor. The conductivity type of the substrate 10 is, for example, the P-type. The semiconductor is, for example, silicon.

Then, the memory hole MH is made in the stacked body 100; and the memory film 30 is formed on the inner wall of the memory hole MH. The memory film 30 is formed by forming the cover insulating film 31, the charge storage film 32, and the tunneling insulating film 33 in this order from the inner wall side of the memory hole MH. For example, the cover insulating film 31 is formed by depositing silicon oxide, or silicon oxide and aluminum oxide, on the stacked body 100 and the inner wall of the memory hole MH. For example, the charge storage film 32 is formed by depositing silicon nitride on the cover insulating film 31. The tunneling insulating film 33 is formed by depositing silicon oxide, or silicon oxide and silicon nitride, on the charge storage film 32.

Then, the semiconductor body 20 is formed on the memory film 30. The semiconductor body 20 is formed by forming the cover layer 20a and the channel layer 20b in this order on the memory film 30. For example, the cover layer 20a is formed by depositing silicon doped with boron on the tunneling insulating film 33. After forming the cover layer 20a, the cover layer 20a and the memory film 30 that are on the bottom portion of the memory hole MH are removed. Thereby, the substrate 10 is exposed from the bottom portion of the memory hole MH. Then, the channel layer 20b is formed on the cover layer 20a and the substrate 10. For example, the channel layer 20b is formed by depositing silicon doped with boron on the cover layer 20a and the substrate 10. Subsequently, crystallization annealing of the cover layer 20a and the channel layer 20b is performed. Thereby, the cover layer 20a and the channel layer 20b are crystallized; and the semiconductor body 20 of the P-type is formed. It is sufficient for the crystallization annealing to be performed after the cover layer 20a and the channel layer 20b are formed. The timing of the crystallization annealing is not limited to the timing of the first embodiment.

Then, an insulator, e.g., silicon oxide, is deposited on the semiconductor body 20; and the memory hole MH is filled with silicon oxide. Thereby, the core layer 50 is formed.

Figure 4:
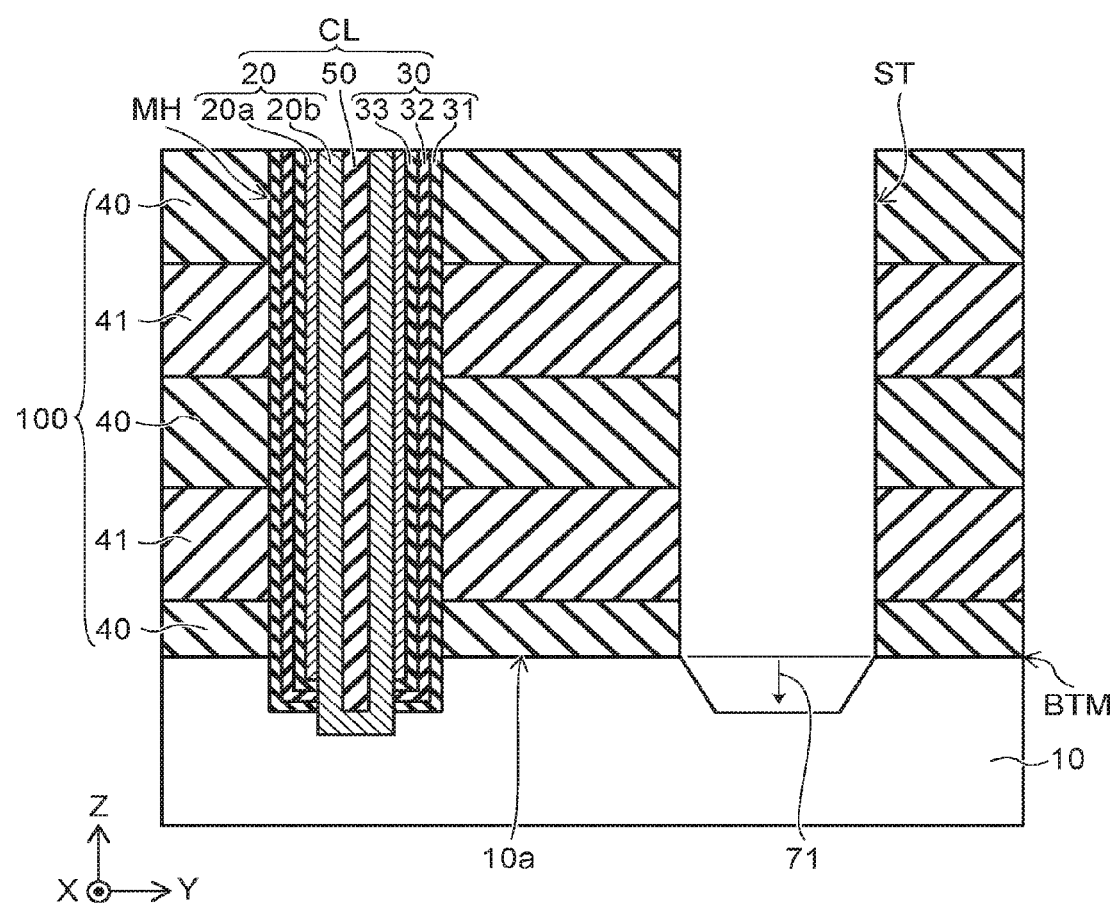

Then, as shown in FIG. 4, the slit ST is made in the stacked body 100. The slit ST is made also in the interior of the substrate 10 via the major surface 10a of the substrate 10. Thereby, the first recess portion 71 is formed in the substrate 10.

Figure 5:
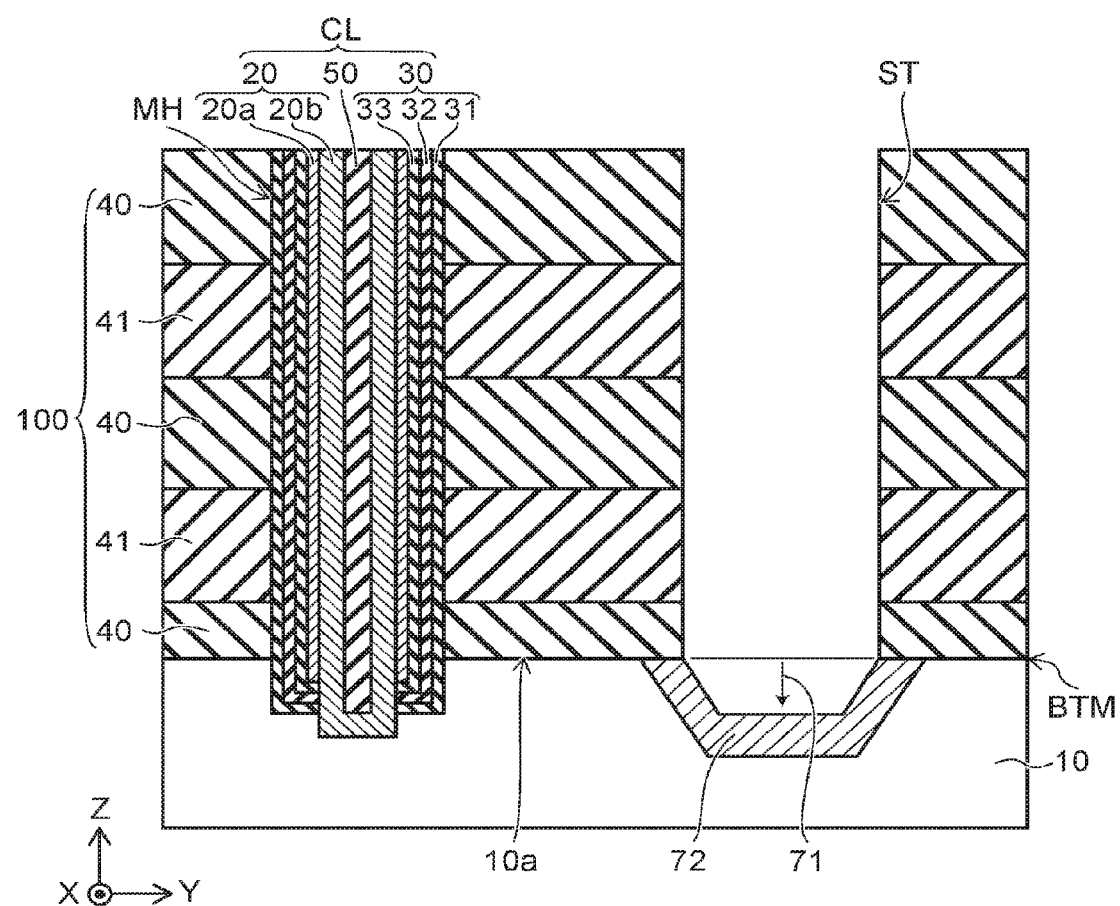

Then, as shown in FIG. 5, the semiconductor region 72 is formed in the substrate 10. The semiconductor region 72 is formed to correspond to the first recess portion 71. For example, the semiconductor region 72 is formed by using a not-shown resist mask layer as a mask and by introducing a carrier of the opposite conductivity type of the substrate 10 in the substrate 10 via the selected slit ST. For example, when the conductivity type of the substrate 10 is the P-type, an N-type carrier (a donor) is introduced to the substrate 10. The N-type carrier (the donor) is, for example, arsenic (As) or phosphorus (P). For example, it is sufficient for ion implantation, etc., to be used to introduce the carrier.

Figure 6:
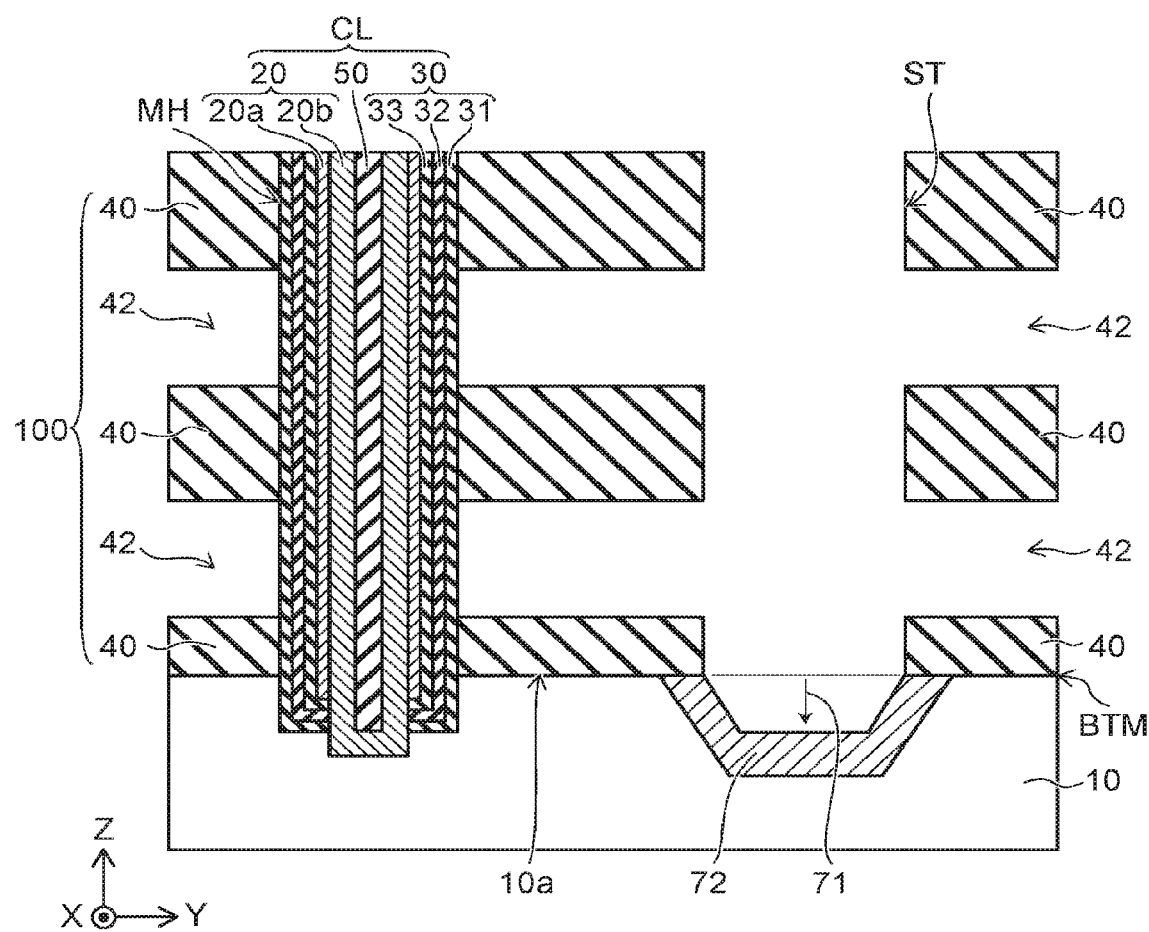

Then, as shown in FIG. 6, the replacement members 41 are removed via the slit ST from the stacked body 100. Thereby, a space 42 is made between the insulator 40 and the insulator 40. The surfaces of the insulators 40 and the columnar portion CL are exposed. In the first embodiment, in the spaces 42, the surface of the cover insulating film 31 of the columnar portion CL is exposed in the stacking direction of the stacked body 100 (the Z-direction); and the surfaces of the insulators 40 are exposed along the planar direction of the stacked body (the XY plane).

Figure 7:
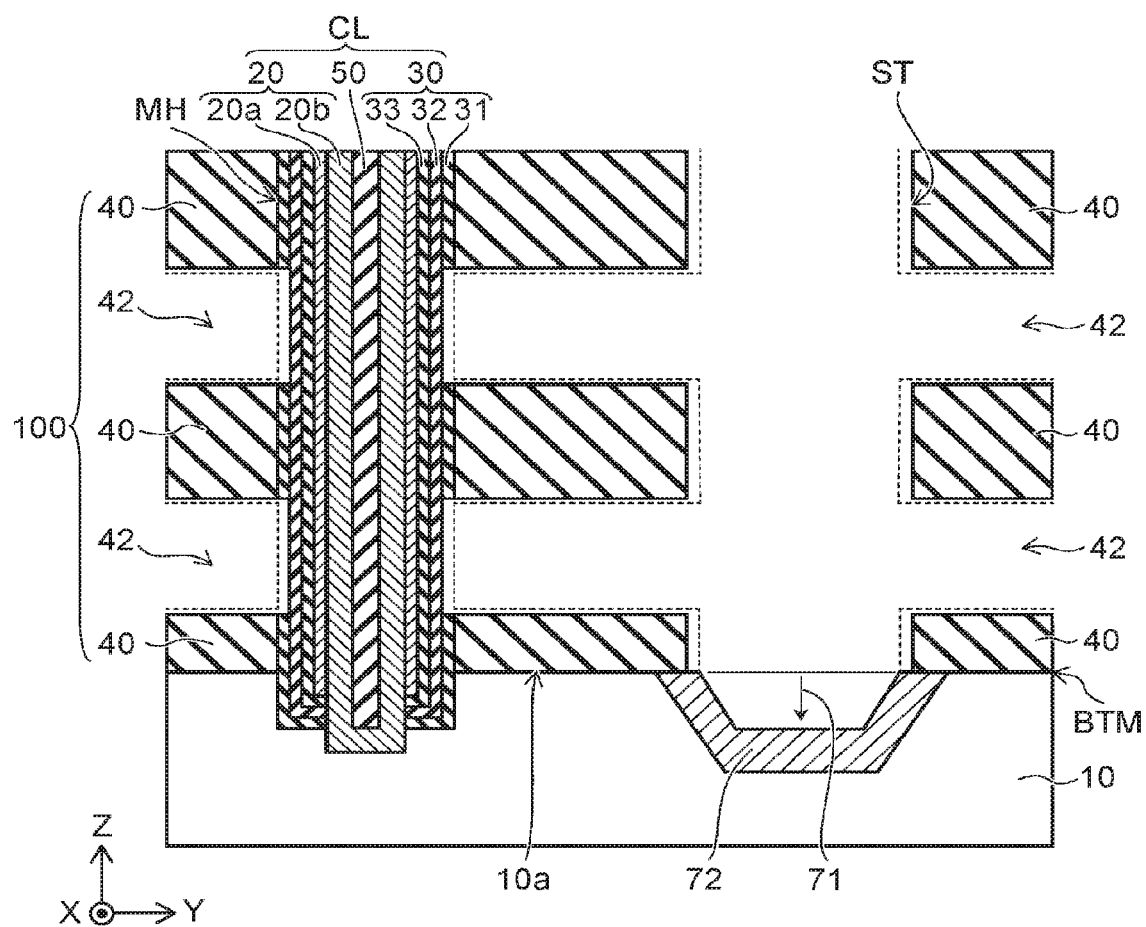

Then, as shown in FIG. 7, the cover insulating film 31 is removed from the columnar portion CL via the slit ST and the spaces 42. Thereby, for example, the charge storage film 32 is exposed from the columnar portion CL. For example, in the first embodiment, the cover insulating film 31 includes silicon oxide. The insulators 40 also include silicon oxide. Therefore, when removing the cover insulating film 31, for example, an amount of the surfaces of the insulators 40 corresponding to the thickness of the cover insulating film 31 is caused to recede.

Figure 8:
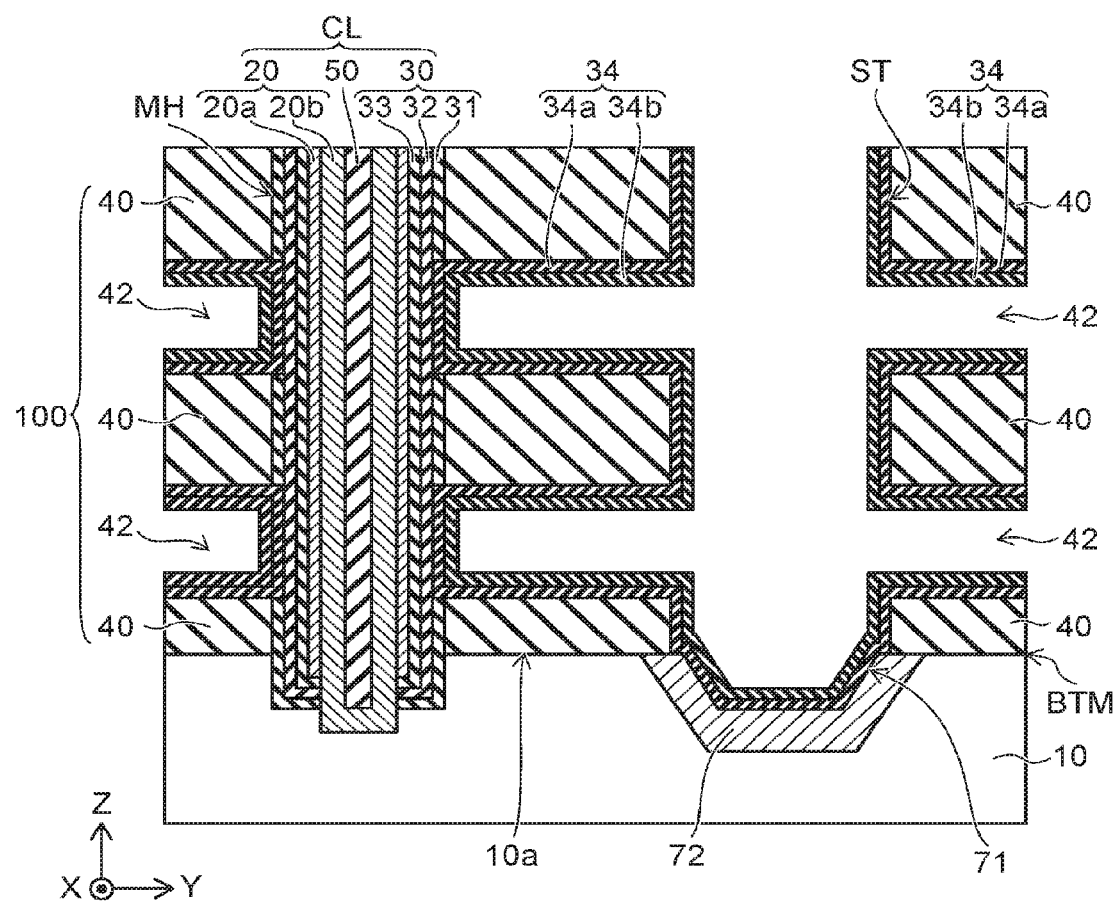

Then, as shown in FIG. 8, the blocking insulating film 34 is formed on the insulators 40, the cover insulating film 41, and the charge storage film 32. The blocking insulating film 34 is formed by forming the first blocking insulating layer 34a and the second blocking insulating layer 34b in this order on the insulators 40, the cover insulating film 41, and the charge storage film 32. For example, the first blocking insulating layer 34a is formed by depositing silicon oxide on the insulators 40, the cover insulating film 31, and the charge storage film 32 via the slit ST and the spaces 42. For example, the second blocking insulating layer 34b is formed by depositing aluminum oxide, e.g., alumina ($Al_2O_3$), on the first blocking insulating layer 34a via the slit ST and the spaces 42.

Figure 9:
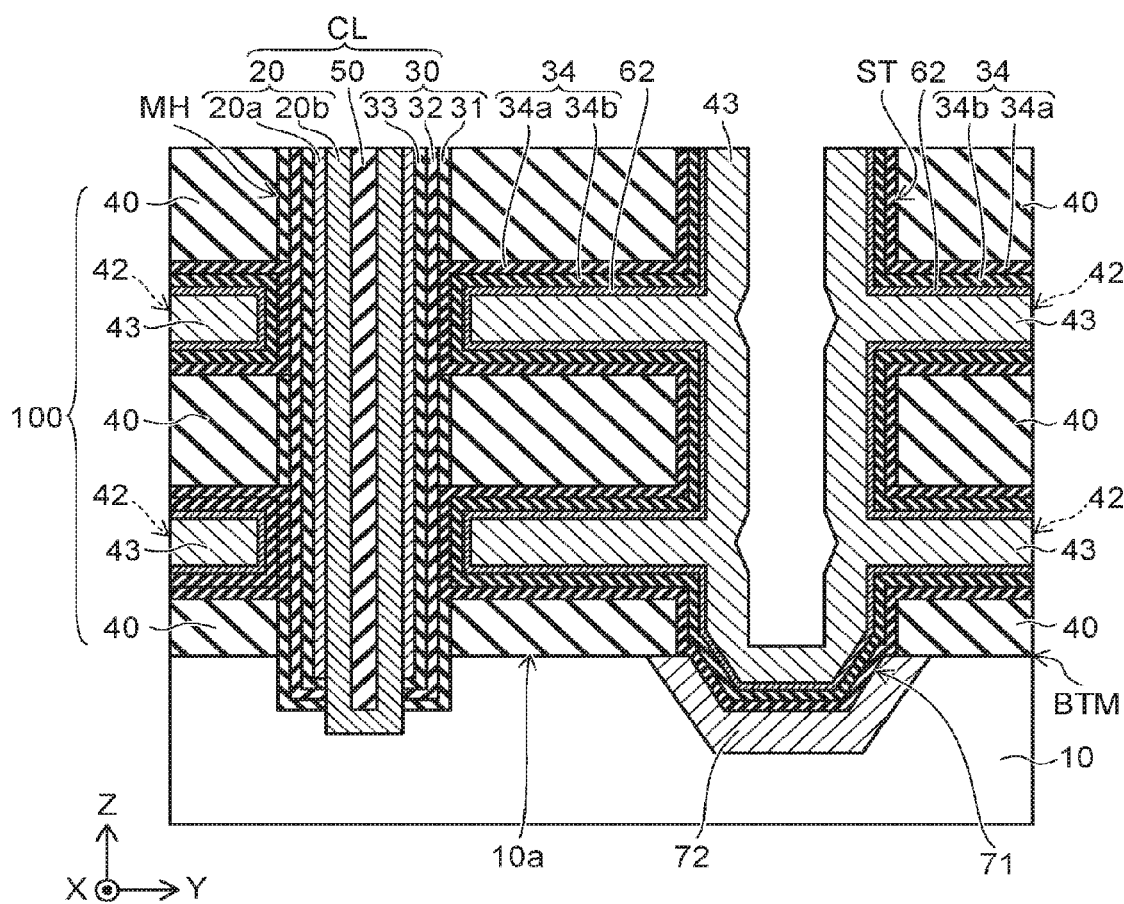

Then, as shown in FIG. 9, the barrier film 62 is formed on the second blocking insulating layer 34b via the slit ST and the spaces 42. For example, the barrier film 62 includes titanium nitride, or includes titanium nitride and titanium. Then, a conductor 43 is formed on the barrier film 62. Thereby, the spaces 42 are filled with the conductor 43. The conductor 43 is a layer used to form the electrode layers (SGD, WL, and SGS) subsequently and includes, for example, tungsten.

Figure 10:
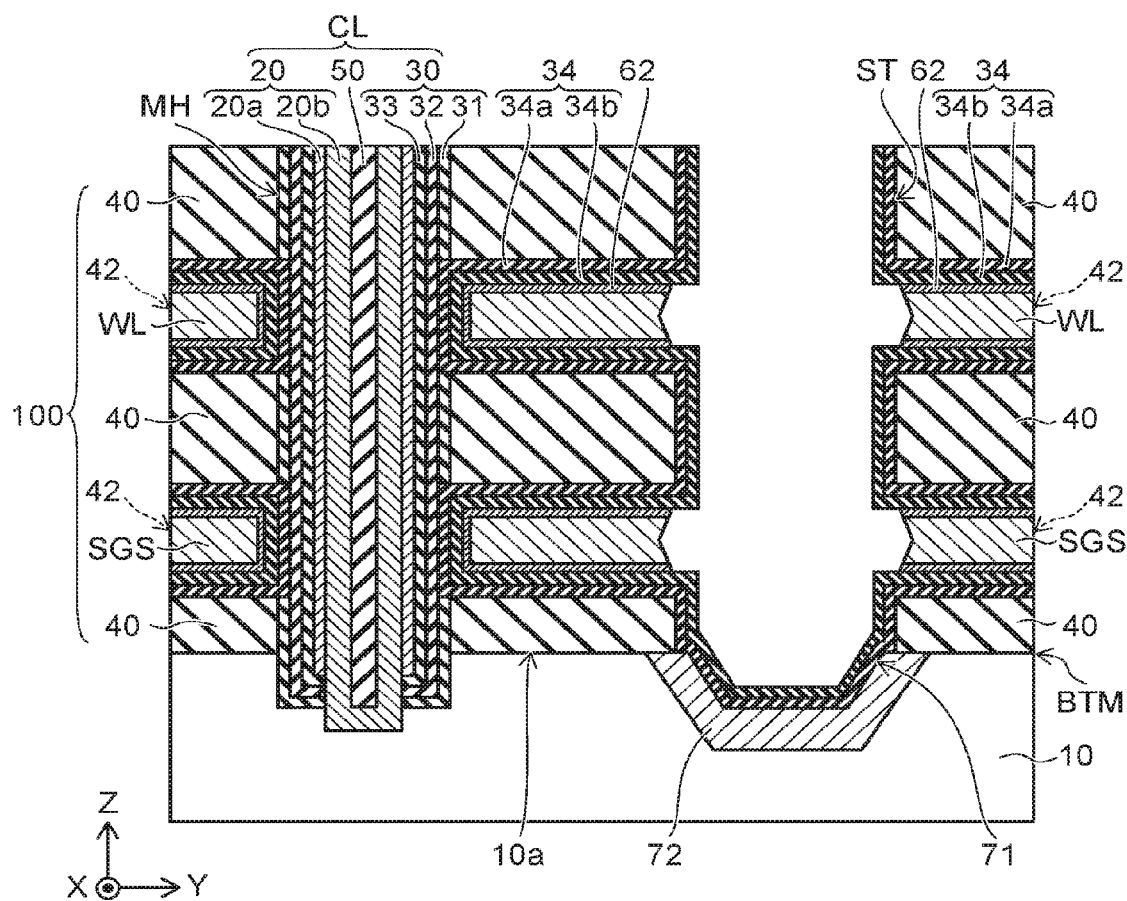

Then, as shown in FIG. 10, the conductor 43 is etched; the portion of the conductor 43 above the blocking insulating films (34a and 34b) of the slit ST is etched; and the conductor 43 is caused to remain in the spaces 42. Thereby, the blocking insulating film 34, the barrier film 62, and the electrode layers (SGD, WL, and SGS: in FIG. 10, referring to SGS and WL) are formed between the insulator 40 and the insulator 40 above the stacked body 100. The word line WL and the source-side selection gate line SGS are shown as the electrode layers in FIG. 10. The removal of the conductor 43 is performed using, for example, anisotropic dry etching and wet etching. The anisotropic dry etching is, for example, reactive ion etching (RIE). The reactant gas that is used in the RIE is a gas including a fluorine-based gas. An example of the fluorine-based gas is $NF_3$. The barrier film 62 that is on the slit ST also is removed when removing the conductor 43.

Figure 11:
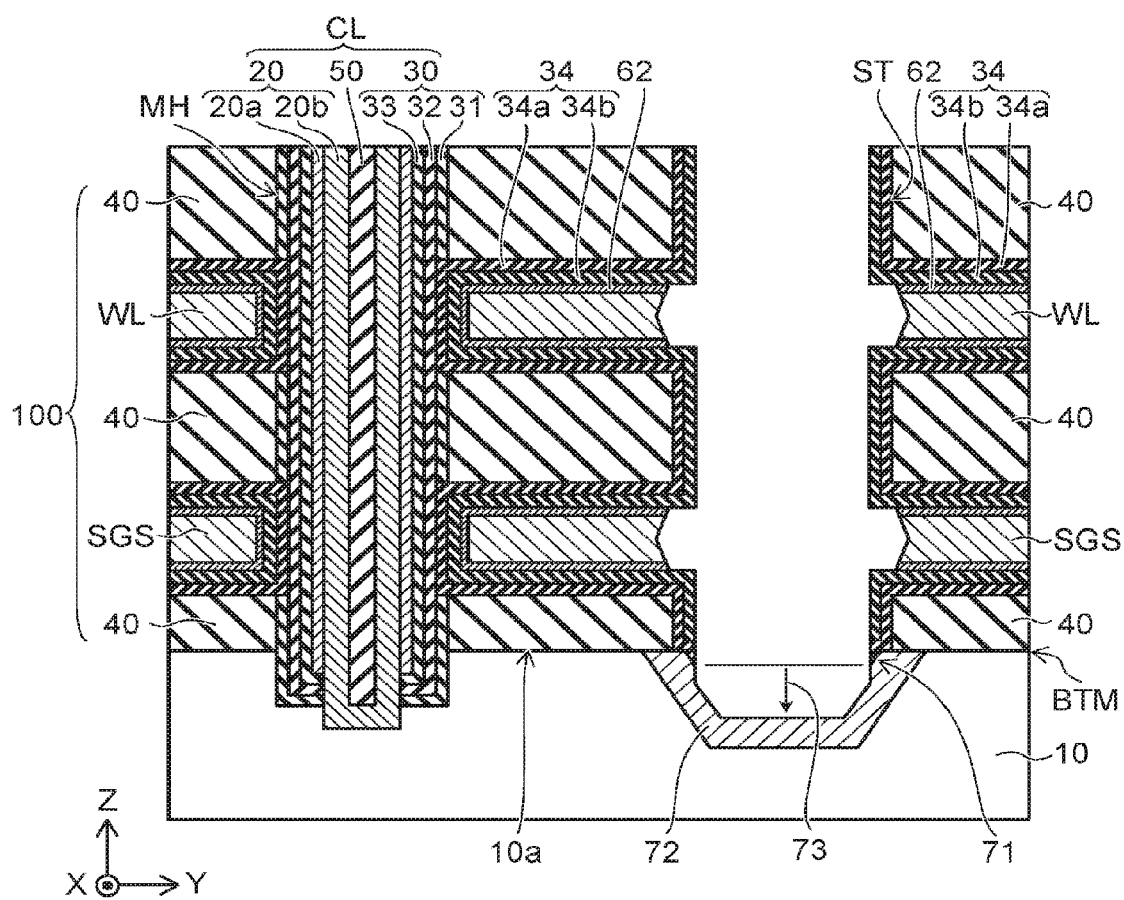

As shown in FIG. 11, the blocking insulating film 34 is removed from the bottom portion of the slit ST. The reactant gas of the removal of the blocking insulating film 34 is a chlorine-based gas. An example of the chlorine-based gas is $Cl_2$ gas. Thereby, the blocking insulating film 34 is removed from the bottom portion of the slit ST. When removing the blocking insulating film 34, the anisotropic dry etching progresses in the substrate 10. Thereby, the second recess portion 73 is formed in the first recess portion 71. For example, the surface of the substrate 10 is exposed from the bottom portion of the second recess portion 73. The semiconductor region 72 is exposed in the first embodiment.

Figure 12:
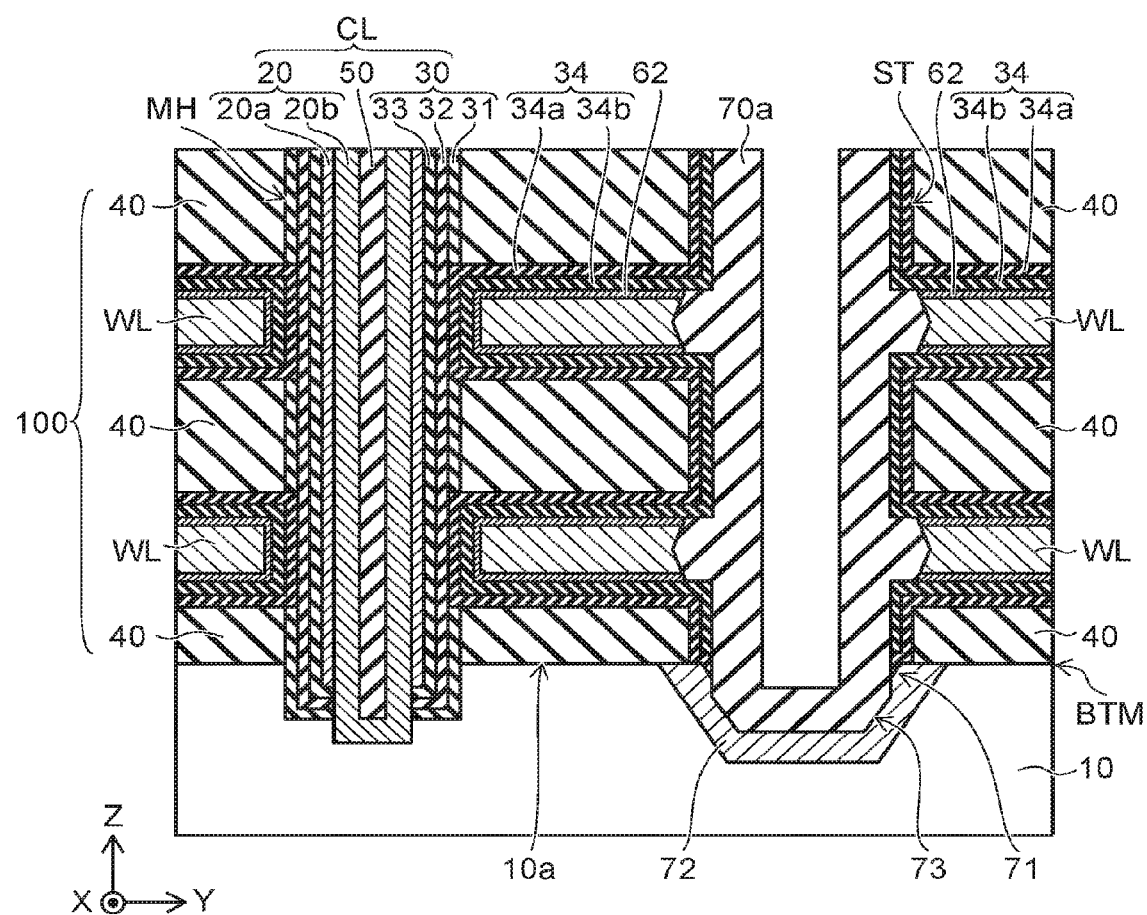

Then, as shown in FIG. 12, an insulating film 70a is formed in the slit ST. Inside the slit ST, the insulating film 70a is formed on the insulator 40 and the electrode layers (SGD, WL, and SGS). For example, the insulating film 70a is formed by depositing silicon oxide on the structure body shown in FIG. 11. The insulating film 70a contacts the substrate 10 at the bottom portion of the second recess portion 73. The insulating film 70a contacts the semiconductor region 72 in the first embodiment.

Figure 13:
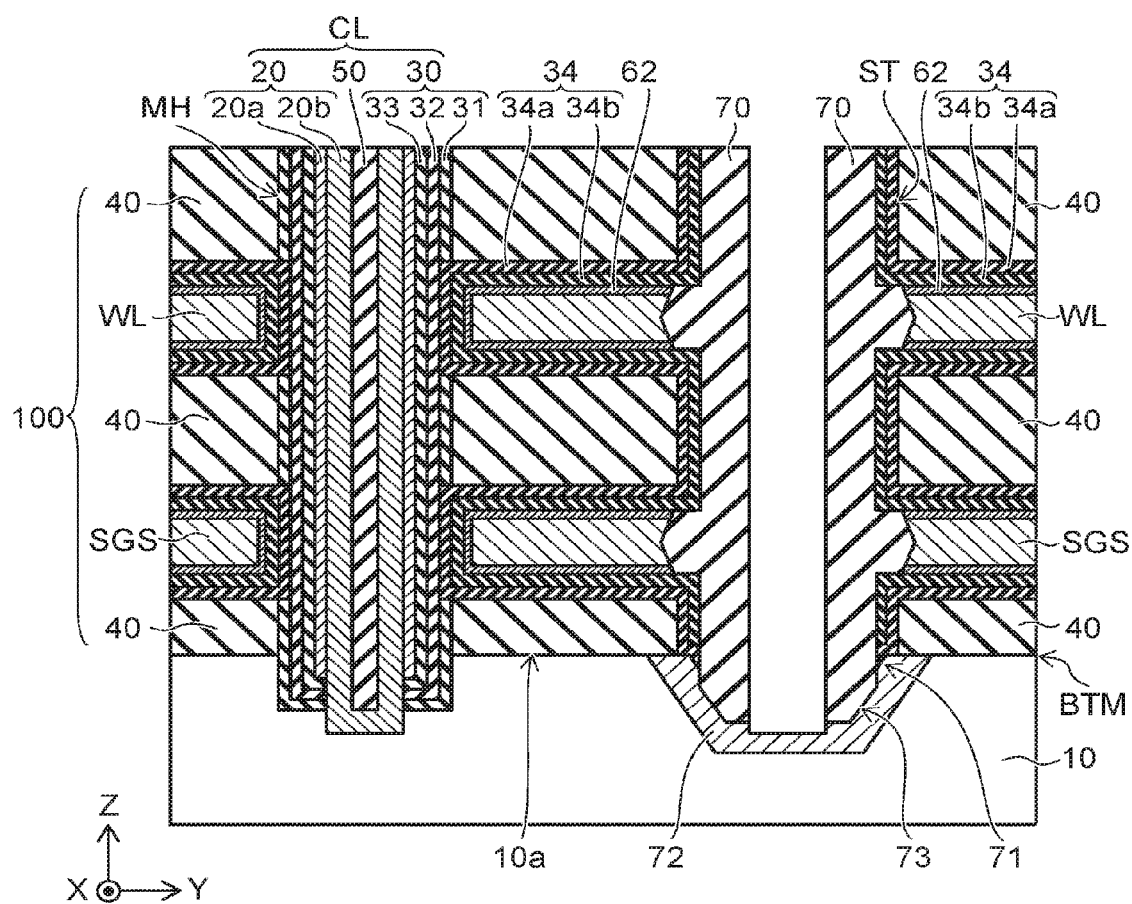

Then, as shown in FIG. 13, the surface of the substrate is exposed by performing, for example, anisotropic dry etching of the insulating film 70a. Thereby, the sidewall insulating film 70 is formed on the inner wall of the slit ST.

Figure 14:
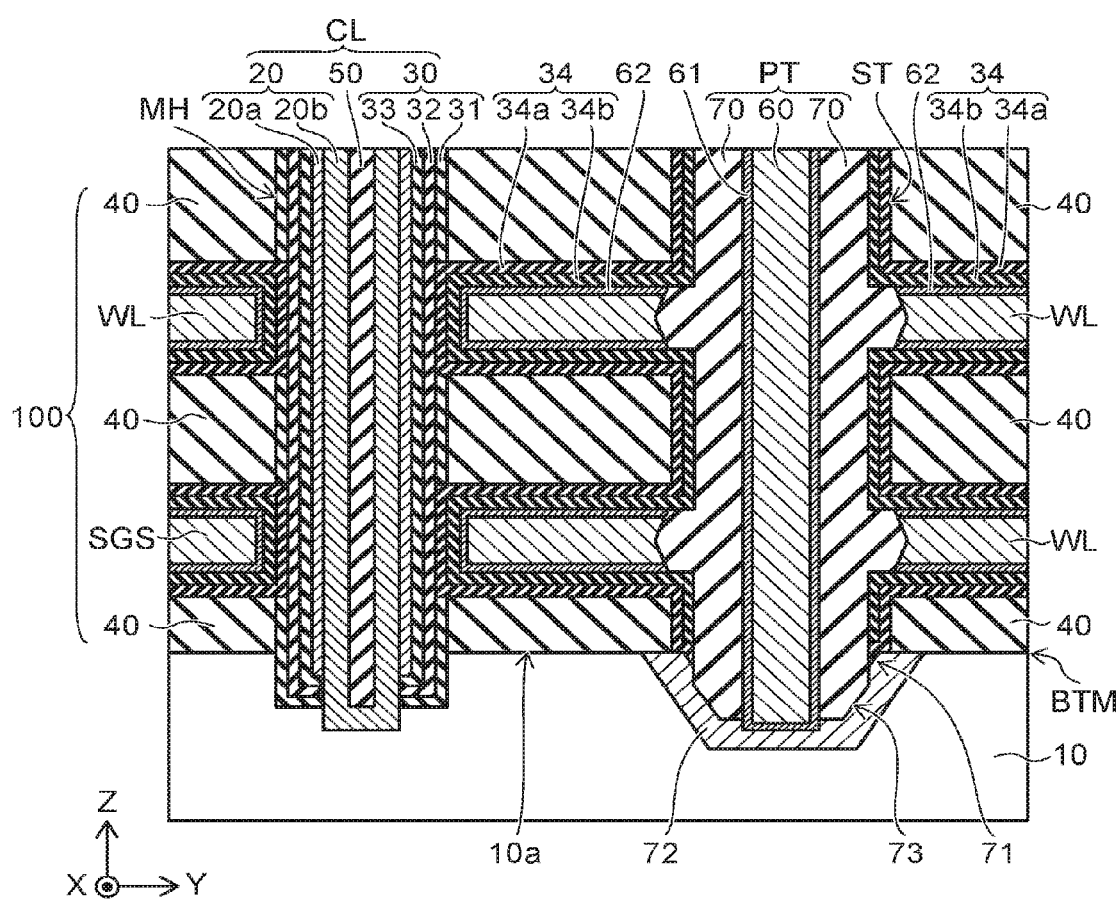

Then, as shown in FIG. 14, the barrier film 61 is formed on the sidewall insulating film 70. For example, the barrier film 61 includes titanium, or titanium nitride and titanium. Then, the conductor 60 is formed on the barrier film 61. Thereby, the slit ST is filled with the conductor 60. The conductor 60 is used to form the source line SL.

For example, the semiconductor device of the first embodiment can be manufactured by such a manufacturing method.

Figure 15:
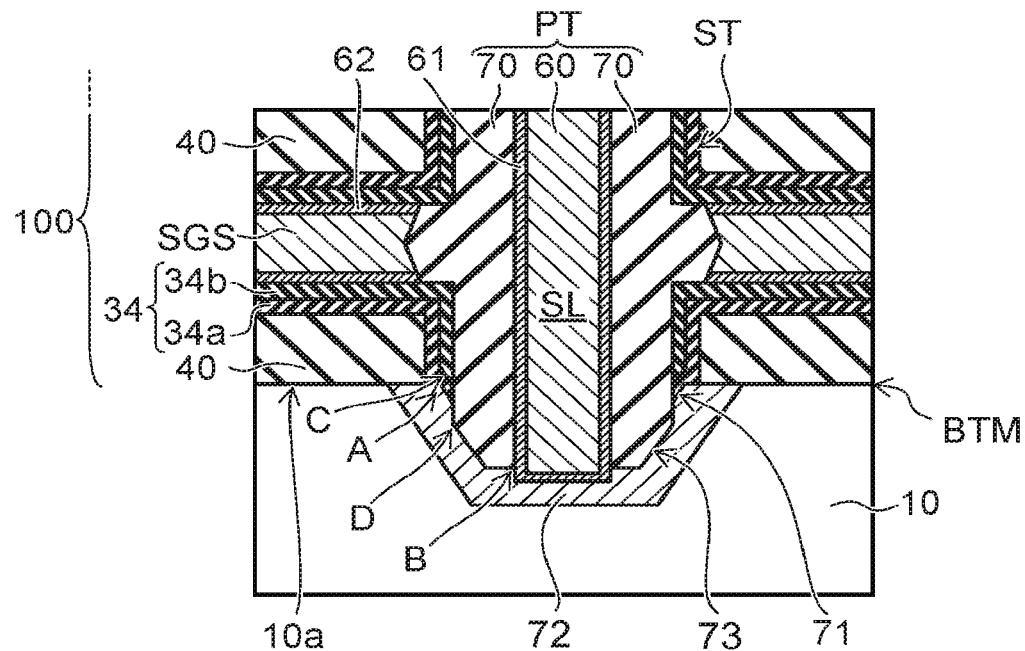
FIG. 15 is a schematic cross-sectional view of the bottom portion of the slit of the semiconductor device of the first embodiment.
Figure 16:
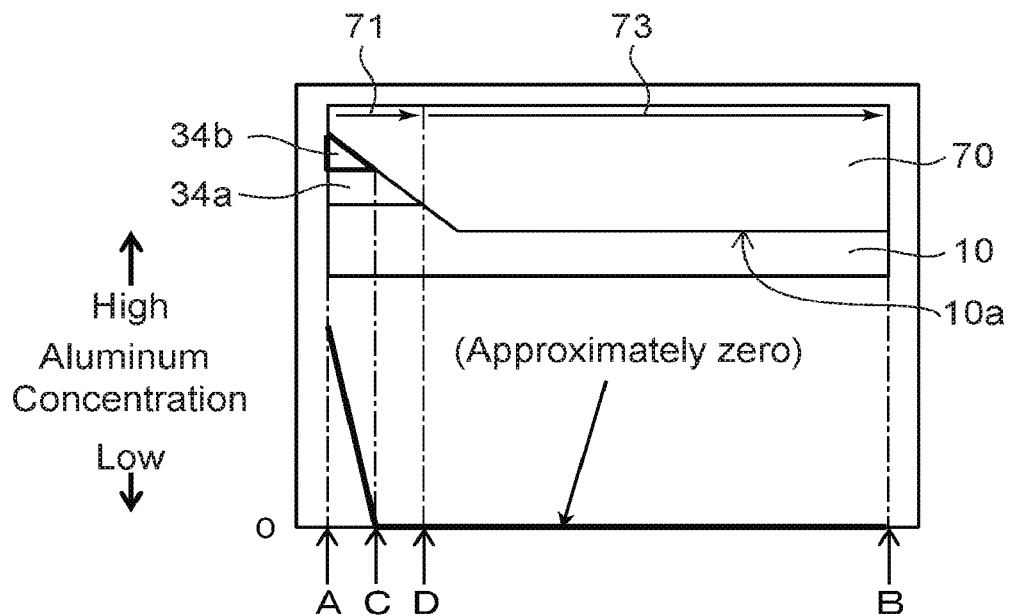
FIG. 16 is a schematic view showing the trend of the aluminum concentration at the bottom portion of the slit of the semiconductor device of the first embodiment.

FIG. 15 is a schematic cross-sectional view of the bottom portion of the slit ST of the semiconductor device of the first embodiment. FIG. 16 is a schematic view showing the trend of the aluminum concentration at the bottom portion of the slit ST of the semiconductor device of the first embodiment.

As shown in FIG. 15, in the semiconductor device of the first embodiment, the sidewall insulating film 70 contacts the major surface 10a of the substrate 10 at the bottom portion of the slit ST (the bottom portion of the second recess portion 73). Thereby, at the bottom portion of the slit ST, the blocking insulating film 34 is separated from the conductor 60 by the sidewall insulating film 70. In the first embodiment, the first blocking insulating layer 34a, the second blocking insulating layer 34b, and the sidewall insulating film 70 exist in the first recess portion 71. The sidewall insulating film 70 exists in the second recess portion 73. The blocking insulating film 34 is separated from the conductor 60 with the sidewall insulating film 70 interposed in the second recess portion 73.

The blocking insulating film 34 includes a metal oxide (the second blocking insulating layer 34b). The metal is, for example, aluminum. Therefore, as shown in FIG. 16, the concentration of aluminum in the structure body on the major surface 10a decreases from portion A toward portion B. Portion A is, for example, the portion where the stepped portion due to the first recess portion 71 starts. Portion B is, for example, the boundary between the conductor 60 and the substrate 10 (in the first embodiment, the barrier film 61 also is considered to be a portion of the conductor 60). Portion C is the portion where the second blocking insulating layer 34b is shielded by the sidewall insulating film 70. Portion D is the portion where the stepped portion of the second recess portion 73 between portion A and portion B starts.

In the first embodiment, because the second blocking insulating layer 34b is shielded by the sidewall insulating film 70, the concentration of aluminum can be reduced from portion C to portion B. For example, as shown in FIG. 16, the aluminum can be "substantially zero" between portion C and portion B. Substantially zero refers to the amount of aluminum decreasing to a level at which the existence of aluminum cannot be detected. That is, in the first embodiment, the amount of aluminum between portion C and portion B can be reduced to be not more than the detection limit of the analysis device. The analysis device is, for example, a secondary ion mass spectrometer.

Figure 17:
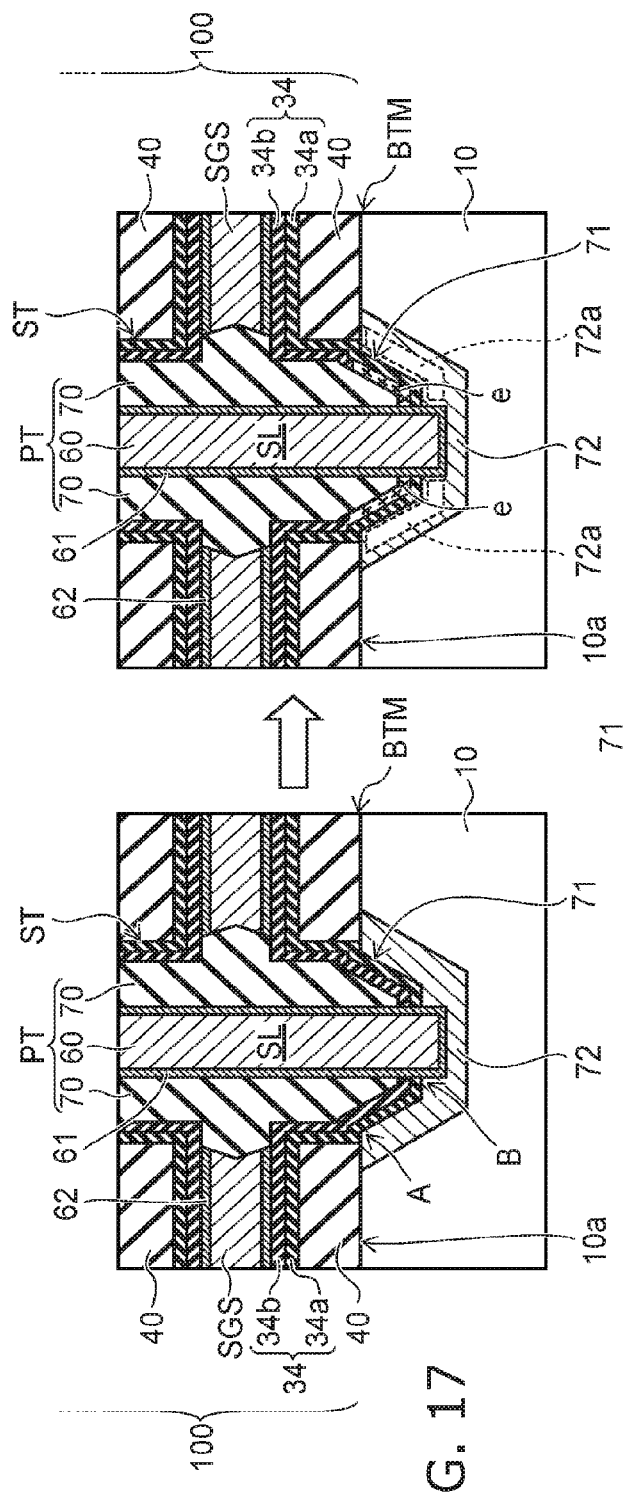
FIG. 17 is a schematic cross-sectional view of the bottom portion of the slit of a semiconductor device of a reference example.
Figure 18:
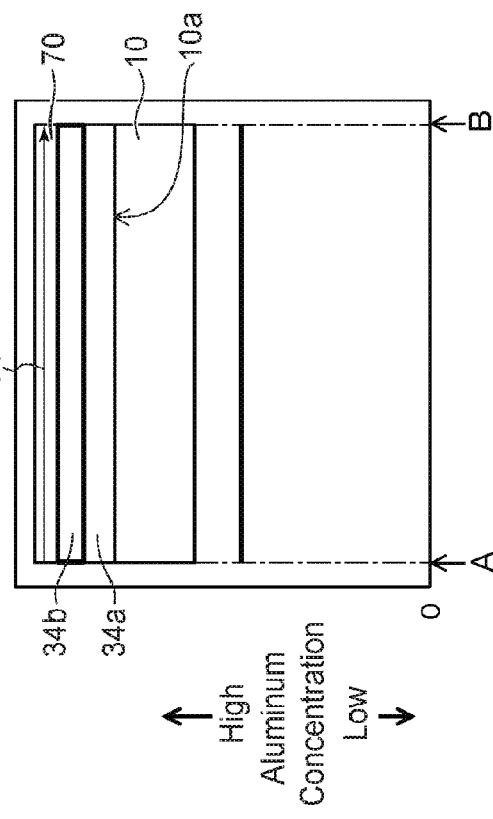
FIG. 18 is a schematic view showing the trend of the aluminum concentration at the bottom portion of the slit of the semiconductor device of the reference example.

FIG. 17 is a schematic cross-sectional view of the bottom portion of the slit ST of a semiconductor device of a reference example. FIG. 18 is a schematic view showing the trend of the aluminum concentration at the bottom portion of the slit ST of the semiconductor device of the reference example.

As shown in FIG. 17, the reference example is the case where the blocking insulating film 34 is not separated from the conductor 60 at the bottom portion of the slit ST. In such a case, as shown in FIG. 18, the concentration of aluminum in the structure body on the major surface 10a is maintained at a high concentration from portion A toward portion B. An oxide that includes a metal, e.g., an oxide that includes aluminum, becomes trap sites that trap electrons. The "x" in the drawing on the right of FIG. 17 schematically shows electrons e trapped in the second blocking insulating layer 34b.

The electrons e are somewhat trapped in the second blocking insulating layer 34b from the initial part of the film formation process. For example, this is because there are processes that use charged particles in the manufacturing processes. Then, the amount of the electrons e trapped in the second blocking insulating layer 34b further increases as the usage time (the operation time) as a semiconductor device increases. This is because the electrons e flow between the source line SL and the memory string MS. As a result, the second blocking insulating layer 34b becomes strongly charged to be "negative" as the usage time increases. As illustrated by reference numeral 72a, the second blocking insulating layer 34b being charged to be "negative" obstructs the semiconductor region 72 from inverting to the N-type or from being of a strong N-type. Therefore, the resistance value between the memory string MS and the source line SL increases; and the cell current does not flow easily. In the case where the cell current does not flow easily, the threshold of the memory cell MC appears to be undesirably high. Accordingly, for example, the determination undesirably may erroneously be "the threshold is high" in the read-out operation. This is "misreading."

Compared to such a reference example, in the semiconductor device of the first embodiment, the concentration of aluminum in the structure body on the major surface 10a decreases from portion A toward portion B. Therefore, compared to the reference example, the likelihood that the electrons e may be trapped in the structure body on the major surface 10a can be reduced. Accordingly, even if the memory device is used for a long period of time, compared to the reference example, the cell current can be caused to flow quickly from the memory string MS to the source line SL.

According to the first embodiment, the cell current can be caused to flow quickly from the memory string MS to the source line SL. Accordingly, for example, even when used for a long period of time, a memory device in which the occurrence of misreading is low and the reliability is high can be obtained.

Figure 19:
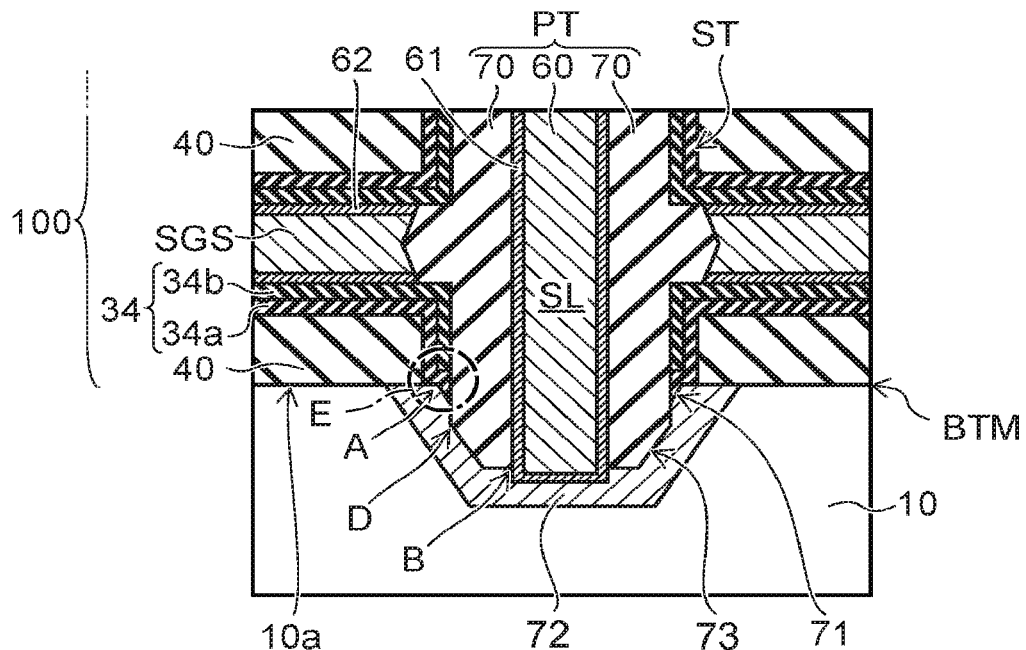
FIG. 19 is a schematic cross-sectional view of the bottom portion of the slit of a semiconductor device of a second embodiment.
Figure 20:
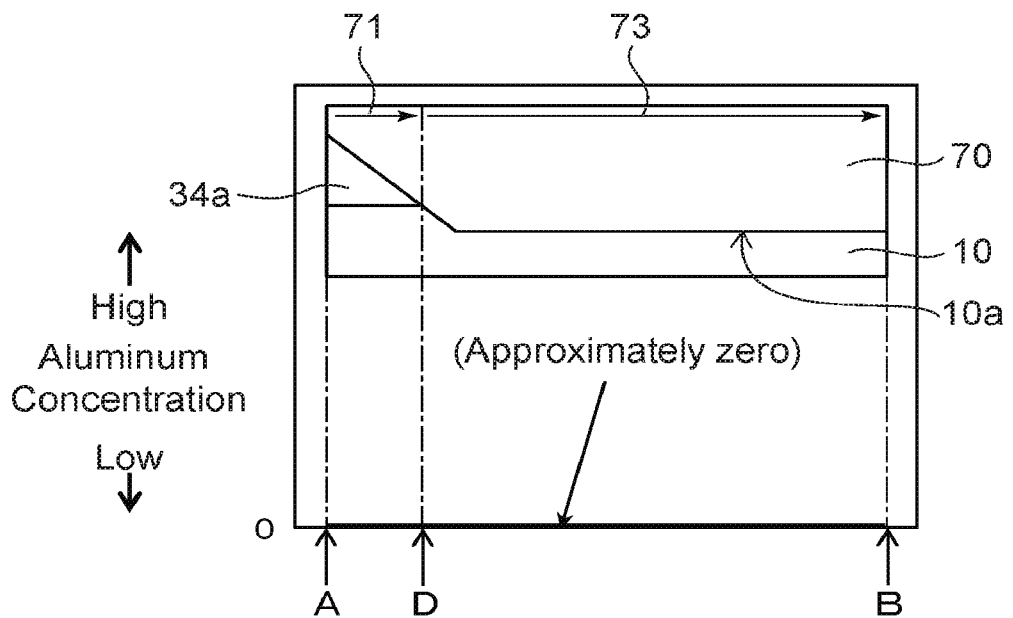
FIG. 20 is a schematic view showing the trend of the aluminum concentration at the bottom portion of the slit of the semiconductor device of the second embodiment.

FIG. 19 is a schematic cross-sectional view of the bottom portion of the slit ST of a semiconductor device of a second embodiment. FIG. 20 is a schematic view showing the trend of the aluminum concentration at the bottom portion of the slit ST of the semiconductor device of the second embodiment.

As shown in FIG. 19, the semiconductor device of the second embodiment differs from the semiconductor device of the first embodiment in that the second blocking insulating layer 34b does not exist in the first recess portion 71 (referring to circle E in FIG. 19). In the second embodiment, the first blocking insulating layer 34a and the sidewall insulating film 70 exist in the first recess portion 71. The sidewall insulating film 70 exists in the second recess portion 73.

Even for a structure such as that of the second embodiment, similarly to the first embodiment, the likelihood that the electrons e may be trapped in the structure body on the major surface 10a can be reduced. In the second embodiment, as shown in FIG. 20, for example, it is possible to set the concentration of aluminum in the structure body on the major surface 10a between portion A and portion B to be substantially zero.

Figure 21:
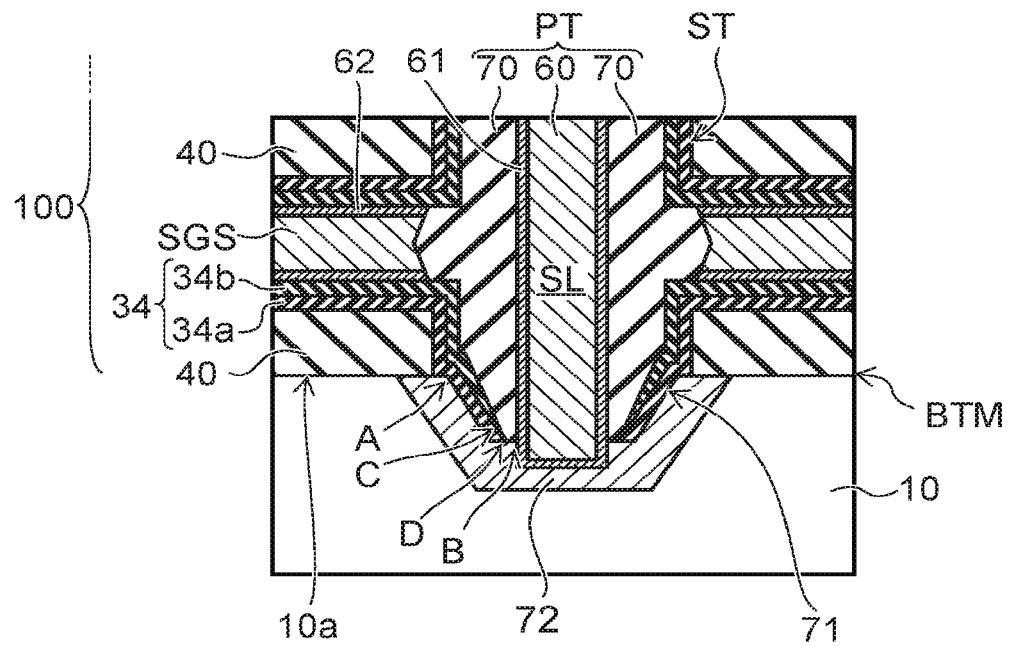
FIG. 21 is a schematic cross-sectional view of the bottom portion of the slit of a semiconductor device of a third embodiment.
Figure 22:
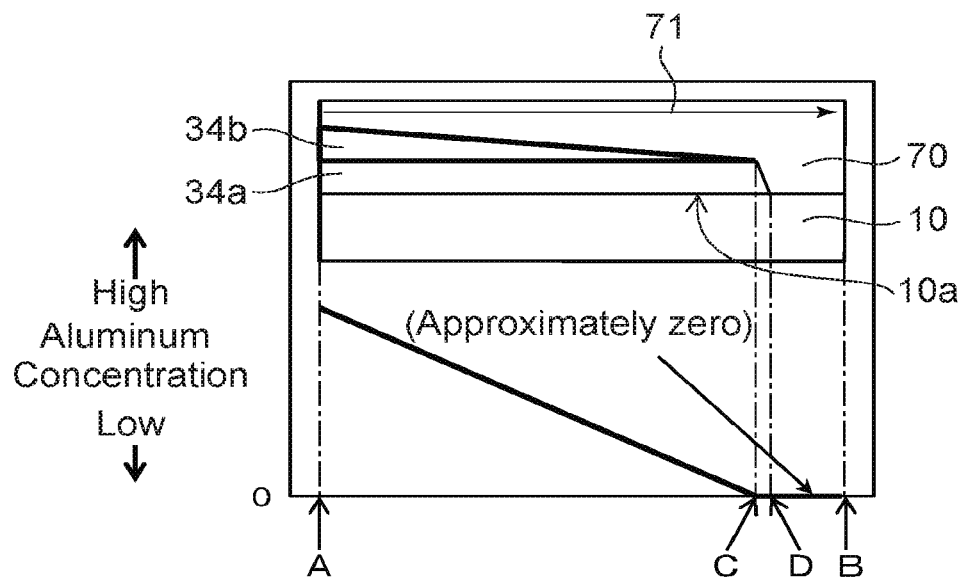
FIG. 22 is a schematic view showing the trend of the aluminum concentration at the bottom portion of the slit of the semiconductor device of the third embodiment.

FIG. 21 is a schematic cross-sectional view of the bottom portion of the slit ST of a semiconductor device of a third embodiment. FIG. 22 is a schematic view showing the trend of the aluminum concentration at the bottom portion of the slit ST of the semiconductor device of the third embodiment.

As shown in FIG. 21, the semiconductor device of the third embodiment differs from the semiconductor device of the first embodiment in that there is no second recess portion 73. In the third embodiment, the first blocking insulating layer 34a, the second blocking insulating layer 34b, and the sidewall insulating film 70 exist in the first recess portion 71. The thickness of the second blocking insulating layer 34b decreases from portion A toward portion B. The second blocking insulating layer 34b vanishes in the first recess portion 71 before reaching the conductor 60. The sidewall insulating film 70 contacts the major surface 10a of the substrate 10 at the bottom portion of the slit ST (the bottom portion of the first recess portion 71). Thereby, the first blocking insulating layer 34a is separated from the conductor 60 by the sidewall insulating film 70 in the first recess portion 71 at the bottom portion of the slit ST.

Even for a structure such as that of the third embodiment, similarly to the first embodiment, the likelihood that the electrons e may be trapped in the structure body on the major surface 10a can be reduced. This is because the concentration of aluminum can be reduced from portion A to portion B as shown in FIG. 22. In the third embodiment as well, for example, the concentration of aluminum in the structure body on the major surface 10a between portion C and portion B can be set to be substantially zero.

Figure 23:
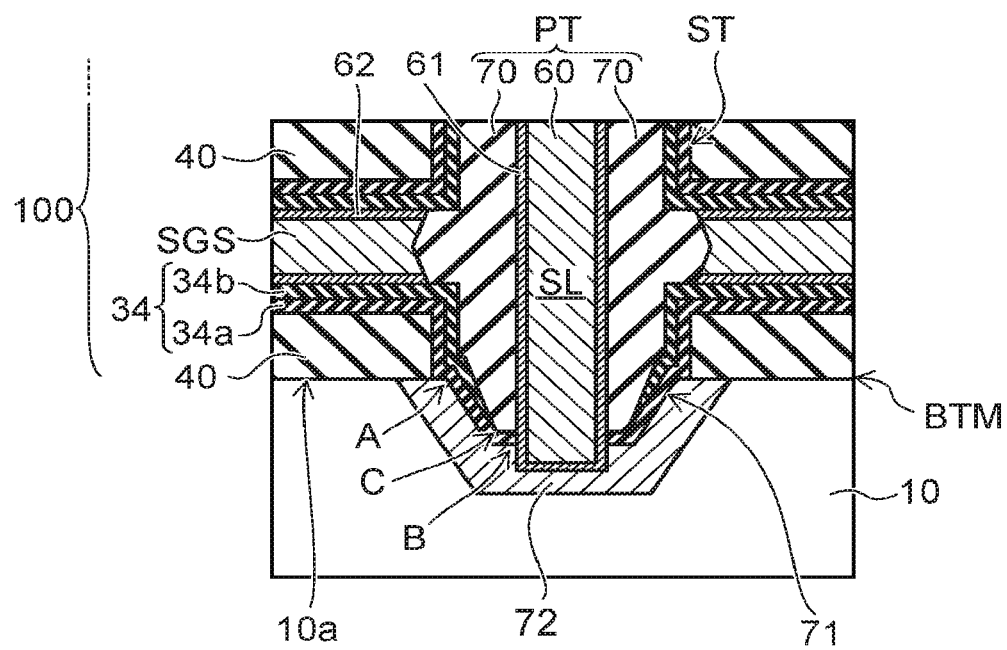
FIG. 23 is a schematic cross-sectional view of the bottom portion of the slit of a semiconductor device of a fourth embodiment.
Figure 24:
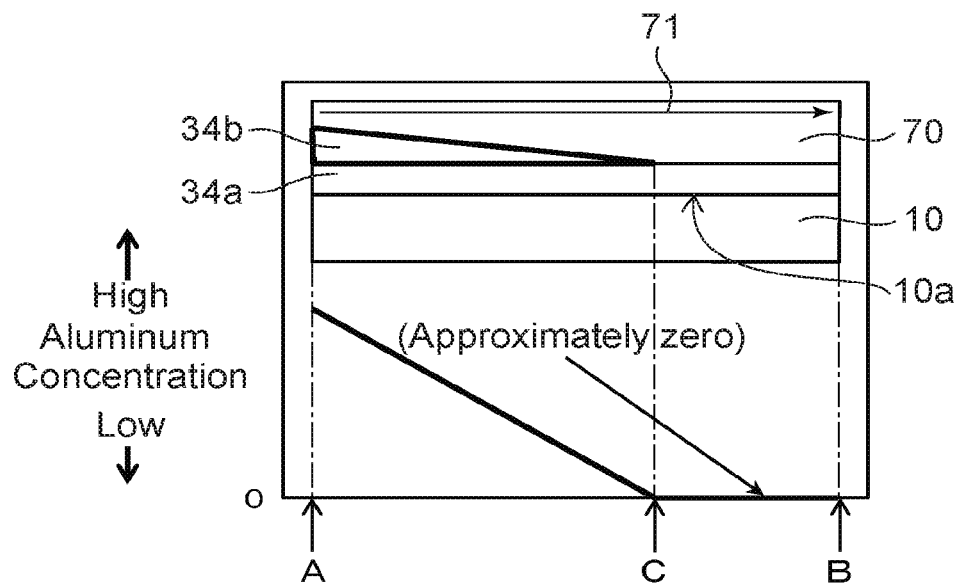
FIG. 24 is a schematic view showing the trend of the aluminum concentration at the bottom portion of the slit of the semiconductor device of the fourth embodiment.

FIG. 23 is a schematic cross-sectional view of the bottom portion of the slit ST of a semiconductor device of a fourth embodiment. FIG. 24 is a schematic view showing the trend of the aluminum concentration at the bottom portion of the slit ST of the semiconductor device of the fourth embodiment.

As shown in FIG. 23, the semiconductor device of the fourth embodiment differs from the semiconductor device of the third embodiment in that the sidewall insulating film 70 contacts the first blocking insulating layer 34a at the bottom portion of the slit ST (the bottom portion of the first recess portion 71).

Even for a structure such as that of the fourth embodiment, similarly to the third embodiment, the likelihood that the electrons e may be trapped in the structure body on the major surface 10a can be reduced. This is because the second blocking insulating layer 34b is shielded by the sidewall insulating film 70 in portion C.

Accordingly, as shown in FIG. 24, for example, the concentration of aluminum in the structure body on the major surface 10a between portion C and portion B can be set to be substantially zero. For example, the first blocking insulating layer 34a substantially does not include aluminum. Therefore, even if the first blocking insulating layer 34a remains in the first recess portion 71, the concentration of aluminum in the structure body on the major surface 10a substantially does not increase.

Thus, according to the embodiments, a semiconductor device in which the cell current can be caused to flow quickly from the memory string MS toward the source line SL can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
   a stacked body provided on a major surface of a substrate, the stacked body including a plurality of electrode layers stacked from the major surface of the substrate with an insulator interposed;
   a columnar portion provided in the stacked body, the columnar portion extending along a stacking direction of the stacked body, the columnar portion including a semiconductor body and a charge storage film, the charge storage film provided between the semiconductor body and the electrode layers;
   a plate portion provided in the stacked body, the plate portion extending along the stacking direction of the stacked body and a first direction crossing the stacking direction, the plate portion including a conductor and a sidewall insulating film, the sidewall insulating film provided between the conductor and the insulator and between the conductor and the electrode layers, the sidewall insulating film contacting the major surface of the substrate, the conductor contacting the major surface of the substrate; and
   a blocking insulating film provided in the stacked body, the blocking insulating film provided between the sidewall insulating film and the insulator, between the insulator and the electrode layers, and between the charge storage film and the electrode layers, the blocking insulating film including a first blocking insulating layer and a second blocking insulating layer, the second blocking insulating layer being different from the first blocking insulating layer.

2. The semiconductor device according to claim 1, wherein
   the first blocking insulating layer is provided to be continuous in the blocking insulating film on the charge storage film side from a lower end portion of the blocking insulating film toward an upper end portion of the blocking insulating film, and
   the second blocking insulating layer is provided to be continuous in the blocking insulating film on the electrode layer side along the first blocking insulating layer.

3. The semiconductor device according to claim 1, wherein
   the substrate includes a first recess portion provided in the major surface of the substrate, and
   the plate portion is provided to correspond to the first recess portion.

4. The semiconductor device according to claim 3, wherein the blocking insulating film, the sidewall insulating film, and the conductor contact the first recess portion.

5. The semiconductor device according to claim 3, wherein a second recess portion is included in the first recess portion.

6. The semiconductor device according to claim 5, wherein
   the blocking insulating film contacts the first recess portion, and
   the sidewall insulating film and the conductor contact the second recess portion.

7. The semiconductor device according to claim 5, wherein the blocking insulating film in the second recess portion is separated from the conductor with the sidewall insulating film interposed.

8. The semiconductor device according to claim 4, wherein the second blocking insulating layer includes a metal.

9. The semiconductor device according to claim 8, wherein a concentration of the metal in the blocking insulating film and the sidewall insulating film decreases toward a boundary portion between the conductor and the substrate from a portion where a stepped portion due to the first recess portion starts.

10. The semiconductor device according to claim 8, wherein
the first blocking insulating layer has a first relative dielectric constant, and
the second blocking insulating layer has a second relative dielectric constant higher than the first relative dielectric constant.

11. The semiconductor device according to claim 10, wherein a metal included in the second blocking insulating layer includes aluminum.

12. The semiconductor device according to claim 6, wherein the second blocking insulating layer includes a metal.

13. The semiconductor device according to claim 12, wherein a concentration of the metal in the blocking insulating film and the sidewall insulating film decreases toward a boundary portion between the conductor and the substrate from a portion where a stepped portion due to the first recess portion starts.

14. The semiconductor device according to claim 12, wherein
the first blocking insulating layer has a first relative dielectric constant, and
the second blocking insulating layer has a second relative dielectric constant higher than the first relative dielectric constant.

15. The semiconductor device according to claim 13, wherein a metal included in the second blocking insulating layer includes aluminum.

16. A semiconductor device, comprising:
a stacked body provided on a major surface of a substrate, the stacked body including a plurality of electrode layers stacked from the major surface of the substrate with an insulator interposed;
a columnar portion provided in the stacked body, the columnar portion extending along a stacking direction of the stacked body, the columnar portion including a semiconductor body and a charge storage film, the charge storage film provided between the semiconductor body and the electrode layers;
a plate portion provided in the stacked body, the plate portion extending along the stacking direction of the stacked body and a first direction crossing the stacking direction, the plate portion including a conductor and a sidewall insulating film, the sidewall insulating film provided between the conductor and the insulator and between the conductor and the electrode layers, the conductor contacting the major surface of the substrate; and
a blocking insulating film provided in the stacked body, the blocking insulating film provided between the sidewall insulating film and the insulator, between the insulator and the electrode layers, and between the charge storage film and the electrode layers, the blocking insulating film including a first blocking insulating layer and a second blocking insulating layer, the second blocking insulating layer being different from the first blocking insulating layer, the blocking insulating film contacting the major surface of the substrate,
the first blocking insulating layer provided to be continuous in the blocking insulating film on the charge storage film side from a lower end portion of the blocking insulating film toward an upper end portion of the blocking insulating film,
the second blocking insulating layer provided to be continuous in the blocking insulating film on the electrode layer side along the first blocking insulating layer,
the sidewall insulating film contacting the first blocking insulating layer at a lower end portion of the columnar portion.

17. The semiconductor device according to claim 16, wherein
the substrate includes a first recess portion provided in the major surface of the substrate, and
the blocking insulating film, the sidewall insulating film, and the conductor contact the first recess portion.

18. The semiconductor device according to claim 17, wherein the second blocking insulating layer includes a metal.

19. The semiconductor device according to claim 18, wherein a concentration of the metal in the blocking insulating film and the sidewall insulating film decreases toward a boundary portion between the conductor and the substrate from a portion where a stepped portion due to the first recess portion starts.

20. The semiconductor device according to claim 18, wherein
the first blocking insulating layer has a first relative dielectric constant, and
the second blocking insulating layer has a second relative dielectric constant higher than the first relative dielectric constant.

21. The semiconductor device according to claim 20, wherein a metal included in the second blocking insulating layer includes aluminum.

* * * * *